US006132818A

United States Patent [19]

Tanaka et al.

[11] Patent Number: 6,132,818

[45] Date of Patent: Oct. 17, 2000

[54] METHOD OF MARKING WITH LASER BEAM

[75] Inventors: Chiharu Tanaka, Kyoso; Tatsuya Nakano, Kyoto; Mitsuo Yonemori, Kyoto; Takeshi Tomita, Kyoto; Masayuki Abe, Noda, all of Japan

[73] Assignees: Omron Corporation, Kyoto; Miyachi Technos Corporation, Chiba, both of Japan

[21] Appl. No.: 08/999,395

[22] Filed: Dec. 29, 1997

[30] Foreign Application Priority Data

| | | | |
|---|---|---|---|
| Dec. 27, 1996 | [JP] | Japan | 8-357725 |
| Aug. 12, 1997 | [JP] | Japan | 9-230261 |
| Sep. 10, 1997 | [JP] | Japan | 9-264829 |

[51] Int. Cl.[7] .......... C23C 14/32

[52] U.S. Cl. .......... 427/596; 427/597; 427/250; 427/261; 427/265; 427/266; 427/287; 427/300

[58] Field of Search .......... 427/596, 597, 427/250, 261, 265, 266, 287, 300; 204/192.1

[56] References Cited

U.S. PATENT DOCUMENTS

| | | | |
|---|---|---|---|
| 3,560,258 | 2/1971 | Brisbane | 117/212 |
| 3,962,513 | 6/1976 | Eames | 428/323 |
| 4,245,003 | 1/1981 | Oransky et al. | 428/323 |
| 4,752,455 | 6/1988 | Mayer | 427/53.1 |
| 5,292,559 | 3/1994 | Joyce, Jr. et al. | 427/597 |
| 5,492,861 | 2/1996 | Opower | 437/173 |
| 5,508,065 | 4/1996 | Weiner | 427/552 |

FOREIGN PATENT DOCUMENTS

| | | |
|---|---|---|
| 57-77590 | 5/1982 | Japan . |
| 60-224588 | 11/1985 | Japan . |
| 2-253988 | 10/1990 | Japan . |
| 3-175088 | 7/1991 | Japan . |
| 5-309552 | 11/1993 | Japan . |
| 6-8634 | 1/1994 | Japan . |

OTHER PUBLICATIONS

Yasuo, "Patent Abstract of Japan" 57 077590 (May 14, 1982).

Susumu, "Patent Abstract of Japan" 03175088 (Jul. 30, 1989).

Susumu, "Patent Abstract of Japan" 02253988 (Oct. 12, 1989).

"Metal–Subliming Laser Turns Out Photomasks" XP–002056954 p. 12 (1970) (no month).

*Primary Examiner*—Timothy Meeks

*Attorney, Agent, or Firm*—Foley & Lardner

[57] ABSTRACT

Prepared is a transcribing plate comprising a glass substrate and a chromium film formed on a surface of the glass substrate. The transcribing plate is disposed on a surface of an object (for example, a glass substrate of a plasma display panel) such that the chromium film faces the surface of the object. The transcribing plate is pressed toward the object, if necessary. A predetermined identification code pattern is drawn on the transcribing plate by a YAG laser beam. The laser beam reaches, through the glass plate, the chromium film to heat it. Chromium vapors generated by the heating are deposited on the surface of the object. This means that the identification code pattern is transcribed on the object surface.

2 Claims, 10 Drawing Sheets

METHOD OF MARKING WITH LASER BEAM

BACKGROUND OF THE INVENTION

1. Field of the invention

The present invention relates generally to a method of marking with a laser beam, and more particularly, to a method suitable for marking of characters, numerals, signs, codes, figures or their combinations representing identification information and the other information on products or articles such as glass, plastics and products including as their parts glass, plastics or the like (for example, a liquid crystal display panel, a plasma display panel, etc. including a glass substrate, or a cathode ray tube) (the products include parts or components), or on members or materials constituting the products (particularly, a transparent or translucent member such as a glass substrate) in a process of manufacturing or fabricating of the products, or in a preceding stage of manufacture.

2. Description of the Prior Art

For management of manufacturing processes, management of manufactured products or members used for the production, and the other management, characters, numerals, signs, codes, figures and the like representing identification information including the date of production, the serial number and so on are marked on products (which have not been completed yet as parts, components, products or articles, or the like in many cases) or on members or materials composing the products in the manufacturing process or in the preceding stage. A special marking method is employed for glass products, products including glass as their parts, or members composing the products (a glass substrate, plate or base, etc.).

For example, JP-A-5-309552 discloses a method of forming small notches representing a binary code on an end face of a glass substrate of a liquid crystal panel (an object to be marked), and a method of directly engraving characters, numerals, signs and the like on the surface of a side edge of a glass substrate with a laser beam.

These methods have some problems. For example, the mark is difficult to read because the glass substrate is transparent. Glass powder is produced in the marking process, and is difficult to remove. The glass substrate is liable to be cracked when the subsequent process includes heat treatment since it has been notched or engraved.

The other marking method is disclosed in JP-A-60224588. This method is a method of placing a metal under a transparent member (an object to be marked) such that it is brought into close contact with the bottom surface of the transparent member, and irradiating the metal with a YAG laser beam through the transparent member from above the transparent member such that the laser beam is focused on the bottom surface of the transparent member. Such control is performed that a gap of less than 10 $\mu$m exists between the transparent member and the metal. Characters and the like are marked on the bottom surface of the transparent member with spatter of the metal by i radiation of the focused laser beam.

In this method, the object to be marked is significantly limited. For example, the method is not applicable to an object which does not transmit or does not easily transmit the laser beam. In the case of an object having another material existing on its surface, for example, coated with an $SiO_2$ film, it is difficult to focus the laser beam on the bottom surface c f the object. The method is not applicable to an object through which the metal is not easily irradiated or cannot be irradiated with the laser beam (for example, a cathode ray tube).

SUMMARY OF THE INVENTION

The present invention is to provide a marking method in which an object to be marked is not damaged or is not significantly restricted.

A method of marking with a laser beam according to the present invention comprises the steps of placing a film of a material which evaporates or sublimates upon being heated by laser beam irradiation and a member exhibiting transparency to the laser beam on a surface of an object at a location to be marked in an overlapped manner, such that the material film faces with the surface of the object, irradiating the material film with the laser beam through the transparent member so as to draw a predetermined pattern to transcribe a pattern formed out of the material on the surface of the object, and separating the transparent member and the material film from the object.

The film is a concept including all of a layer, a film, a foil, and a coat. Consequently, the material film may be formed on a surface of a transparent material (a transparent plate), or alternatively the material film may be a foil or a film independent of the transparent member. It is considered that the transcription is made by evaporation (deposition) coating or sputtering of the material of the film in the air. Accordingly, it is preferable that the material is suitable for evaporation coating or sputtering. When the object is transparent, it is preferable that the material is opaque and particularly has a color (including black or white). It is desirable that the transparent member is a plate. A glass plate, a plastic plate, Mylar (Trademark of du Pont, a polyethylene terephthalate film), etc. can be used as the transparent member. A predetermined pattern includes characters, numerals, signs, codes, figures and the like (including a one-dimensional bar code and a two-dimensional bar code) and their combinations.

According to the marking method in the present invention, the object is not cut or engraved. Therefore, the object is not cracked even if the marking process is followed by, particularly, heat treatment. According to the marking method in the present invention, no glass powder or the like is produced. Therefore, the marking method is also applicable to manufacturing processes requiring a high degree of cleaning. Further, a marked pattern can be also visually confirmed, easily read optically, and accurately read in a case where an opaque material (which is as opaque as chromium in many cases) is used as the material which evaporates or sublimates upon being heated.

According to the present invention, the laser beam is irradiated through the transparent member from behind the transparent member, and is not irradiated through the object to be marked. Therefore, an applicable object is hardly limited. The marking method according to the present invention is applicable to an opaque object, and an object through which the laser beam cannot be irradiated, for example, a cathode ray tube.

The size of a gap between the material film and the surface of the object must be maintained in a suitable range. If the gap is too narrow, heat is accumulated when the material film is heated by the laser beam, so that the transparent member and the object may be welded together. If the gap is too wide, the pattern transcribed on the surface of the object is blurred. The gap between the material film and the surface of the object mainly depends on the accuracy of the surface of the object.

When the accuracy of the surface of the object is relatively low, and the gap is too wide, the transparent member may be pressed toward the object to adjust the gap.

When the accuracy of the surface of the object is relatively high, and the gap is too narrow, a spacer pattern may be formed on the surface of the object by the following procedure prior to marking.

1. The material film and the transparent member are placed on the object in an overlapped manner. Thereafter, a spacer pattern is drawn by a laser beam on an area other than a marking area where a predetermined pattern is to be drawn.

2. The material film and the transparent member are temporarily separated from the object, and the position of the material film and the transparent member is slightly shifted.

3. The material film and the transparent member are placed again on the surface of the object in an overlapped manner. Thereafter, the predetermined pattern is drawn by the laser beam through the transparent member.

Preferably, the spacer pattern is drawn symmetrically on both sides of the marking area.

Since the gap between the material film and the surface of the object is narrow, not only the material film but also the transparent member and the object are melted by laser beam irradiation, so that the transparent member and the object may be welded together. In drawing the spacer pattern by the laser beam, the intensity per unit area of the laser beam or a time period during which the laser beam is continuously irradiated must be adjusted in such a manner that heat is not so accumulated that the transparent member and the object are melted.

After the spacer pattern is formed on the surface of the object by the drawing thereof, the material film and the transparent member are temporarily separated from the object, to shift the position of the material film and the transparent member, and the material film and the transparent member are placed again on the surface of the object. When the material film and transparent member are raised and lowered using an automatic machine such as a handler or a lifter, the position of the material film and the transparent member relative to the object is slightly shifted unavoidably just by separating the material film and the transparent member from the object and placing the material film and the transparent member again, owing to the accuracy of the automatic machine. It should be understood that shifting the position of the material film and the transparent member includes not only positively shifting but also unavoidably shifting as described above.

After drawing the spacer pattern, the material film and the transparent member are temporarily separated from the object, to shift the position thereof, and are placed again on the surface of the object, which results in the material film and the transparent member being on the spacer pattern on the surface of the object. Consequently, the gap between the material film and the surface of the object is widened. When the predetermined pattern is drawn by the laser beam, therefore, the transparent member and the object are not welded together, thereby making the marking possible.

In a preferred embodiment of the present invention, the transcribed pattern obtained by the marking is read from the object, and it is checked that the pattern is correctly transcribed. It is possible to exclude the object which is not correctly marked for any cause.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 illustrates a state where a transcribing plate is raised, and FIG. 13 illustrates a state where the transcribing plate is lowered.

PREFERRED EMBODIMENT OF THE INVENTION

Figure 1:
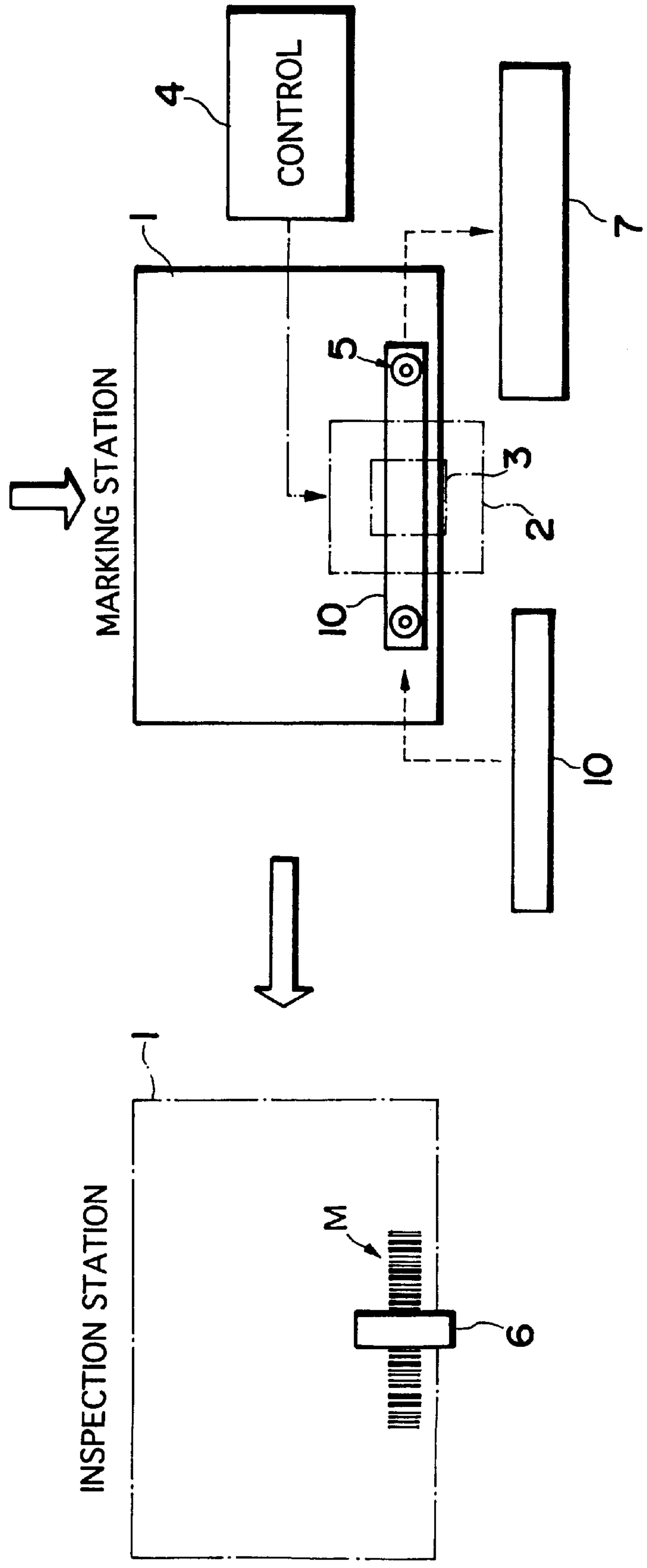
FIG. 1 schematically illustrates the marking process provided in a part of the production line.

The marking process is provided in a part of the production line, or at a preceding stage. The marking process is provided with a marking station and an inspection station as shown in FIG. 1.

An object to be marked 1 is transferred to the marking station by a conveyor (not shown), and is positioned therein. An example of the object 1 is a glass substrate, plate or base of a plasma display panel. A handler (a transfer apparatus) 5 of a transcribing plate 10 is arranged in the marking station (also see FIG. 3). The handler 5 includes vacuum caps, and takes up the uppermost one of the transcribing plates 10 stacked on a stacking tray and places the taken-up transcribing plate in a predetermined position (a location to be marked) on the object 1 positioned in the marking station.

A YAG laser marker 2 is disposed above the marking station. The marker 2 includes a YAG laser, and a scanner of a laser beam. One example of the YAG marker 2 is disclosed in JP-A-6-8634. A signal (data) representing an identification code (representing identification information comprising the date, the serial number, etc.) to be marked on the object 1 is fed to a controller 4 (or produced in the controller 4). The transcribing plate 10 is irradiated with a laser beam emitted from the marker 2 through a lens system 3 under the control of the controller 4. A mark drawn by the laser beam represents an identification code to be marked. The identification code is transcribed on the surface of the object 1 by laser beam irradiation.

Thereafter, the transcribing plate 10 is lifted by the handler 5 (also see FIG. 4), and is transferred to a collecting box 7. The object 1 marked with the identification code is fed to the inspection station in a subsequent stage by the conveyor.

An optical reader 6 for reading the identification code marked on the surface of the object 1 is disposed in the inspection station. The identification code read by the reader 6 and the identification code which the controller 4 instructs the marker to mark are verified by the controller 4 or a computer (not shown). If both coincide with each other, it is judged that the object 1 is correctly marked. The correctly marked object 1 is fed to a subsequent stage. The object which is not judged to be correctly marked is excluded from the production line.

Figure 2:
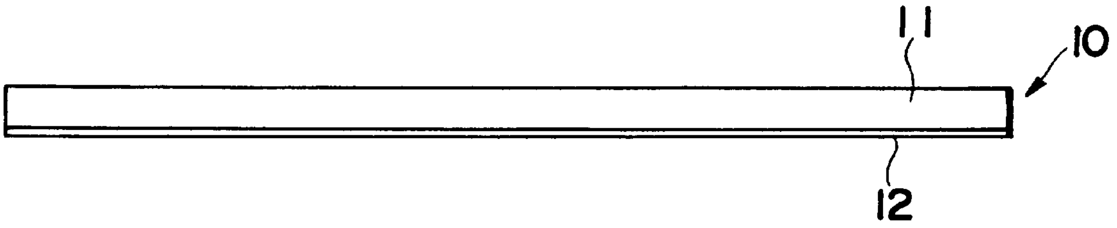
FIG. 2 is a cross-sectional view of a transcribing plate.

FIG. 2 illustrates the structure of the transcribing plate 10. The transcribing plate 10 comprises a substrate 11 exhibiting transparency to the wave length of a laser beam to be irradiated and a thin film 12 formed on a surface (a bottom surface) of the substrate 11. When the laser marker 2 includes a YAG laser (wavelength=about 1.06 μm), it is preferable that the substrate 11 is a glass substrate, plate or base (for example, soda-lime glass). It is preferable that the thin film 12 is formed of a material which evaporates or sublimates upon being heated by laser beam irradiation, and is opaque. An example is a chromium thin film (melting point=1600° C.). The chromium thin film 12 is uniformly formed on the glass substrate 11 by vacuum evaporation (deposition) or sputtering.

The laser beam from the marker 2 is transmitted through the glass substrate 11 and focused on the chromium thin film 12 on the bottom surface thereof. It is preferable that the glass substrate 11 is thin, considering effects such as the effect of the refraction of the laser beam by the glass substrate 11. If the glass substrate 11 is too thin, it may be cracked by heating the chromium thin film 12. It is preferable that the thickness of the glass substrate 11 is approximately 0.5 mm to 2.0 mm. In the present embodiment, the thickness of the glass substrate 11 is 0.7 mm.

The thickness of the chromium thin film 12 is substantially preferably 100 nm to 300 nm, although it can be suitably determined depending on the marking quality. It is approximately 180 nm in the present embodiment.

Examples of the material of the glass substrate include alkali-free glass, anti-strain glass (glass whose strain point is at high temperatures) in addition to the foregoing materials.

Referring to FIGS. 3 to 7, the marking method will be described more specifically.

Figure 3:
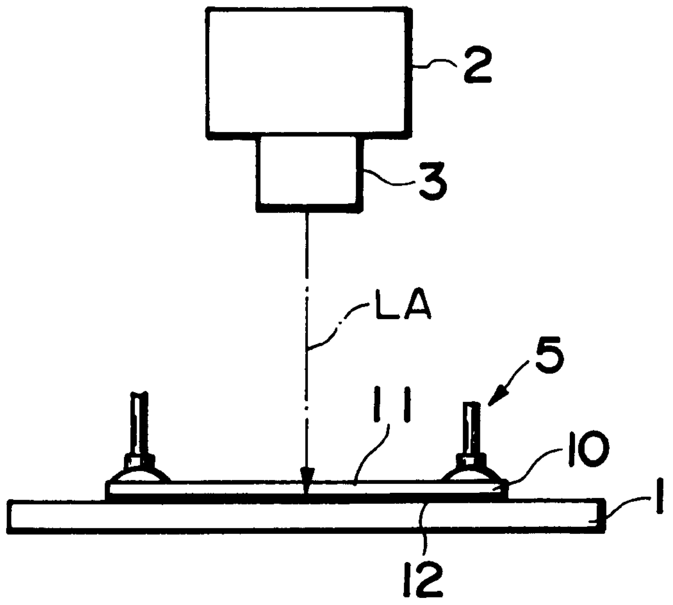
FIGS. 3 and 4 illustrate the procedure for marking.

As shown in FIG. 3, the transcribing plate 10 is placed on the surface of the object (for example, a plasma display glass substrate (hereinafter referred to as a PDP glass substrate) 2.8 mm in thickness in the present embodiment) 1 at a location where an identification code is to be marked such that the chromium thin film 12 faces the surface of the object 1. Both ends of the transcribing plate 10 are sucked by the vacuum cap of the handler 5. Pressure is applied to the transcribing plate 10 as required as described later through the vacuum cap and its support rod (a piston rod) by the handler 5, to bring the transcribing plate 10 into close contact with the surface of the object 1.

The laser marker 2 is then driven, to irradiate the chromium thin film 12 with a laser beam LA through the transcribing plate 10 from above the transcribing plate 10 (from the opposite side of the object 1). The laser beam is focused on the chromium thin film 12 by the lens system 3 (laser spot diameter=about 50 to 100 μm, and laser beam intensity=about 30 to 50 MW/mm$^2$). Although the drawing method will be described in detail later, a pattern of the identification code is drawn in a marking area (indicated by a chain line AR in FIG. 5) on the transcribing plate 10 by the laser beam.

Figure 7:
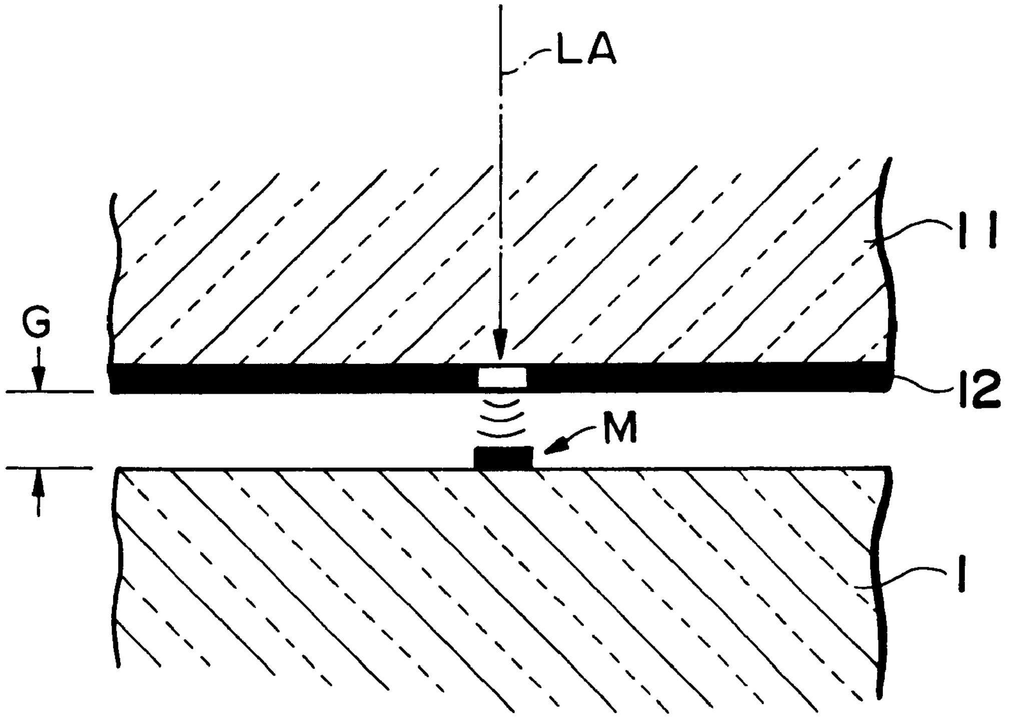
FIG. 7 is an enlarged sectional view showing how transcription is made on the surface of an object.

As shown in enlarged fashion in FIG. 7, a very small gap G generally exists between the surface of the object 1 and the chromium thin film 12 of the transcribing plate 10. The chromium thin film 12 heated by laser beam irradiation instantaneously evaporates or sublimates. Chromium vapors or particles (molecules) jet toward the surface of the object 1, and adhere to the surface of the object 1. This is considered to be evaporation coating or sputtering in the air.

Figure 4:
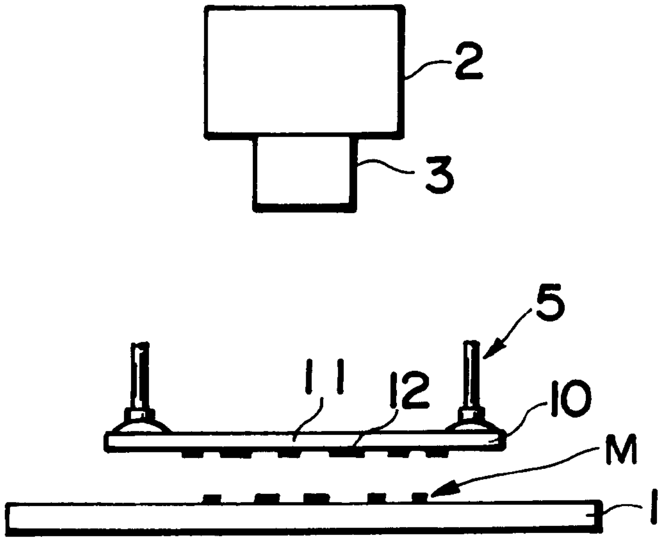
Figure 5:
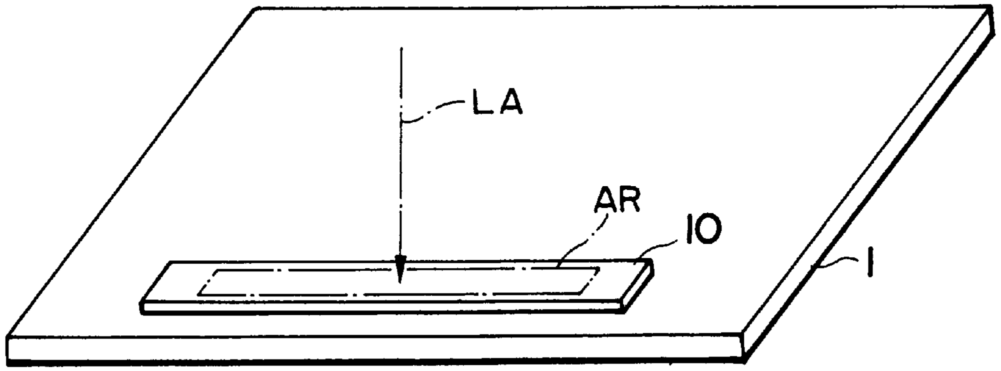
FIG. 5 is a perspective view showing how an identification code pattern is being drawn.
Figure 6:
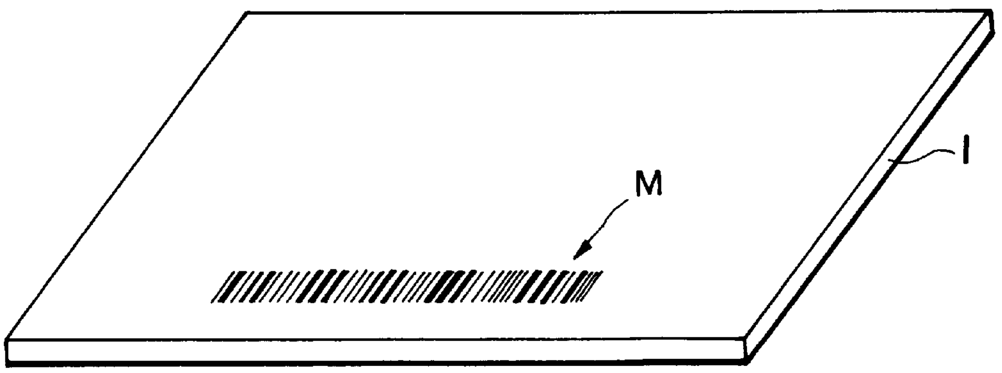
FIG. 6 is a perspective view showing an example of a marked identification code pattern.

When the drawing of the identification code by the laser beam is terminated, the transcribing plate 10 is separated from the object 1 upon being pulled up by the handler 5, as shown in FIG. 4. An identification code pattern M formed out of chromium is transcribed on the surface of the object 1. An example of the transcribed identification code pattern M is shown as a bar code in FIG. 6. As the identification code pattern, characters, figures, signs, codes and the like and their combinations can be employed in addition to a bar code (including not only a one-dimensional bar code but also a two-dimensional bar code).

The size of the gap G between the surface of the object 1 and the chromium thin film 12 is important. The chromium thin film 12 is heated to a temperature far beyond the melting point of glass (about 600° C.). If the gap G is too narrow, therefore, heat is accumulated in the heated chromium thin film 12 and a glass portion in the vicinity thereof, so that not only the chromium thin film but also the glass portion is melted. Accordingly, the PDP glass substrate which is the object 1 and the glass substrate 11 of the transcribing plate 10 are welded together. When the gap G is too wide, the chromium vapors are diffused before they reach the surface of the object 1, so that the identification code pattern transcribed on the object 1 is blurred. Further, particles having weak adhesion, like soot, which are considered to be an oxide of chromium attach on the pattern and its periphery (which can be removed by being wiped, although the wiping process is required).

Experiments have showed that when the object 1 is the PDP glass substrate, the transcribing plate 10 is a glass substrate having a chromium thin film formed thereon, and the YAG laser is used, the gap G is preferably approximately 1 μm to 30 μm and is most suitably approximately 1 μm to 5 μm (the glass is not welded, and a clear pattern can be transcribed).

The surface of the object 1 has various accuracies. The accuracy of the surface of the normal PDP glass substrate (the difference between a convex and a concave) is approximately 40 μm. When the PDP glass substrate is used an object, the gap G is too large, so that the transcribing plate 10 is pressed toward the object 1, to ensure that the gap G is in a suitable range. In the case of the PDP substrate, the most suitable identification code pattern can be transcribed by applying pressure of approximately 20 to 30 gf/cm$^2$.

If the accuracy of the surface of the object 1 is suitable for formation of the gap G in the above-mentioned preferable range, the transcribing plate 10 may be merely placed on the surface of the object 1 or may be only held such that the position thereof is not shifted.

When the accuracy of the surface of the object 1 is very high, the gap G may be so small as not to reach 1 μm. In such a case, a spacer pattern may be formed on the surface of the object 1 as described later.

According to the conventional marking method disclosed in JP-A-60-224588 previously described, the object and the metal are disposed in this order, and the laser beam is irradiated through the object from behind the object. Experiments conducted by the inventors have showed that in the conventional method, the metal which evaporated is liable to be diffused, a transcribed identification code pattern is liable to be blurred, and an oxide, like soot, having weak adhesion easily attaches to the object.

As shown in enlarged fashion in FIG. 7, in the present invention, the glass substrate 11, the chromium thin film 12 and the object 1 are disposed in this order, and the laser beam is irradiated through the glass substrate 11 from behind the glass substrate 11. The chromium vapors which evaporated or sublimated upon being heated by the laser beam jet in the direction in which the laser beam travels, and adhere to the surface of the object 1 opposite thereto. According to the marking method of the present invention, a clear identification code pattern is easy to form, and a material such as soot is hardly produced, or is produced in small amounts.

Typical examples of a method of drawing an identification code pattern using a laser beam include a raster scanning method and a method of drawing with one stroke. The raster scanning method is a method of modulating the intensity of a laser beam and applying the laser beam to only a location where a pattern is to be drawn while raster-scanning the laser beam (linear scanning in the horizontal direction is repeated while slightly shifting the position in the vertical direction).

Figure 8A:
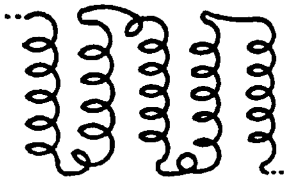
FIGS. 8*a* and 8*b* and 8*c* illustrate how an identification code pattern is drawn with one stroke.
Figure 8B:
Figure 8C:
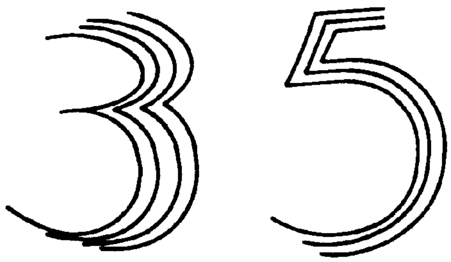

The method of drawing with one stroke is suitable for a case where the intensity of a laser beam is not so high. This method includes a wobbling method for scanning a laser beam so as to draw a circle while shifting its center and painting an area where a pattern is to be drawn, as shown in FIG. 8*a*, and a method of scanning a laser beam such that straight lines, curved lines or lines composed of their combinations having approximately the same shapes are drawn while shifting the position thereof, as shown in FIGS. 8*b* and 8*c*. The method shown in FIG. 8*a*, the method shown in FIG. 8*b*, and the method shown in FIG. 8*c* are respectively suitable for drawing of thick lines, drawing of bar codes, and drawing of characters.

Description is made of an embodiment in which a spacer pattern is formed on the surface of the object 1 when the accuracy of the surface of the object 1 is high, and the gap between the chromium thin film 12 of the transcribing plate and the surface of the object 1 does not reach 1 μm.

Figure 9A:
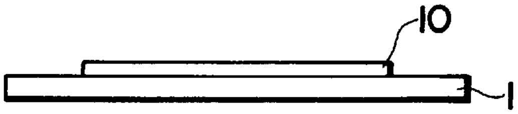
FIGS. 9*a* to 9*e* illustrate the procedure in an embodiment in which a spacer pattern is formed before marking.

In FIG. 9*a*, the transcribing plate 10 is placed on the object 1 at a location where the identification code pattern is to be marked such that the chromium thin film 12 of the transcribing plate 10 faces the surface of the object 1. Pressure in the direction in which the transcribing plate 10 is pressed against the object 1 need not be applied to the transcribing plate 10. However, it is preferable that the transcribing plate 10 is so held as not to move (by the above-mentioned handler 5, for example).

Figure 9B:
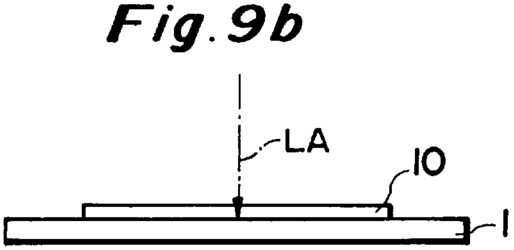

In FIG. 9*b*, a spacer pattern is drawn by the laser beam LA upon driving the laser marker 2 in a position outside an area where the identification code pattern is to be drawn (a marking area, which is indicated by a chain line AR in FIGS. 10 and 11) and preferably in close proximity thereto on the transcribing plate 10 from above the transcribing plate 10.

Figure 10:
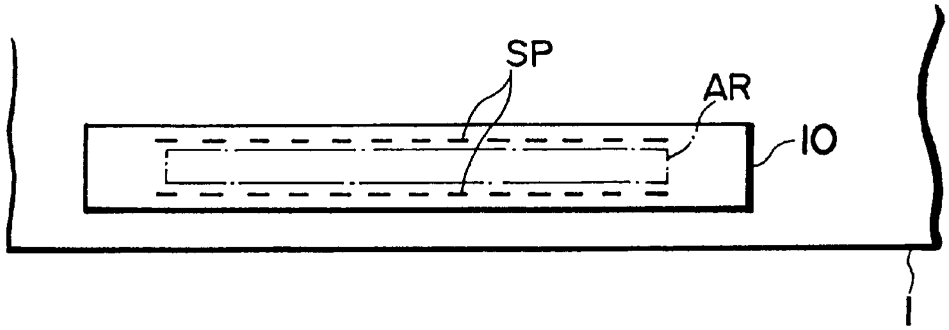
FIGS. 10 and 11 illustrate examples of drawing of a spacer pattern.
Figure 11:
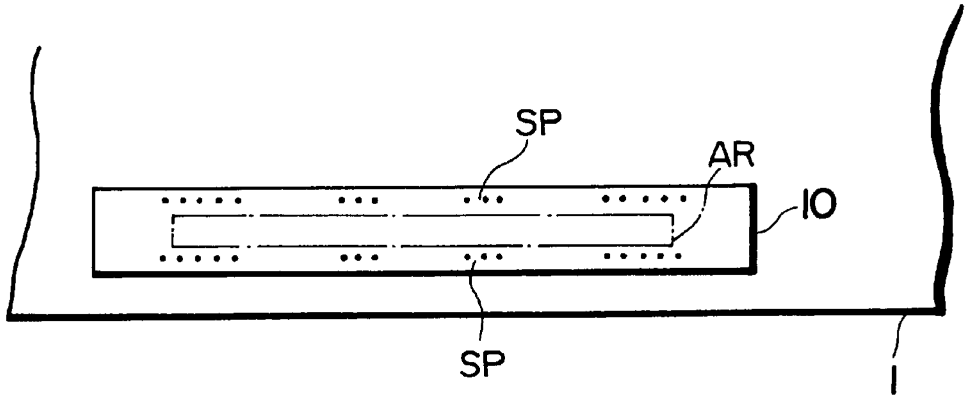

An example of the drawing of the spacer pattern is illustrated in FIGS. 10 and 11. The spacer pattern is formed on both sides of the marking area and preferably symmetrically. A spacer pattern SP illustrated in FIG. 10 is composed of two parallel broken lines. The spacer pattern SP illustrated in FIG. 11 is composed of a group of dots.

The chromium thin film 12 of the transcribing plate 10 is brought into close contact with the surface of the object 1 with a gap of not more than 1 μm therebetween. When a strong laser beam is irradiated for a long time with it being focused on the chromium thin film 12, heat is accumulated in a portion of the chromium thin film and vicinity thereof, so that the upper glass substrate 11 and the lower object (the PDP glass substrate) 1 are welded together. In order to prevent such a situation from being produced, the laser beam is irradiated in such a degree that heat is not so accumulated that glass is welded in forming the spacer pattern.

For this purpose, a time period during which the laser beam is irradiated is shortened. That is, the laser beam is irradiated intermittently (even in the same position or in different positions). In place thereof or in addition thereto, the amount of laser energy per unit area is reduced. Output of a laser is lowered, or its focus is slightly blurred.

In the drawing of the spacer pattern shown in FIG. 10, the YAG laser is intermittently irradiated. Further, the intensity of the laser light is set to approximately 3 to 10 $MW/mm^2$, and the spot diameter of the laser light is set to 50 to 100 μm. The length of each of the broken lines composing the spacer pattern SP is approximately 1 mm. The size of the marking area AR is approximately 5 mm×100 mm, and the entire length of the spacer pattern SP is approximately 105 mm.

Figure 9C:
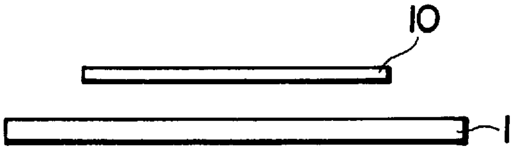
Figure 12:
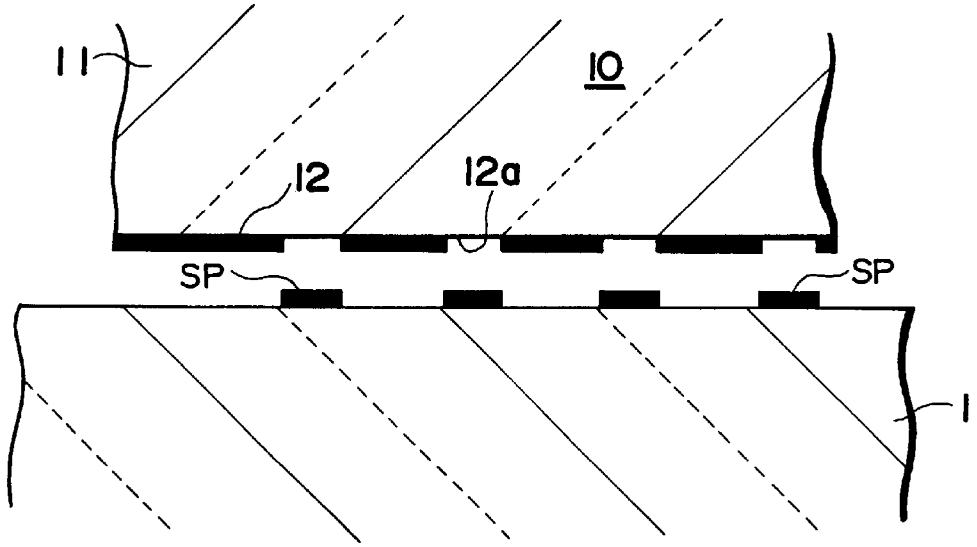
FIGS. 12 and 13 are enlarged sectional views showing how a spacer pattern is formed, where

After drawing the spacer pattern, the transcribing plate 10 is separated from the object 1 upon being lifted upward slightly (by about 5 mm) by the handler 5, as shown in FIG. 9*c*. As shown in FIG. 12, the spacer pattern SP is transcribed on the surface of the object 1, and a corresponding portion of the chromium thin film is missing (indicated by a reference numeral 12*a*). The position of the transcribing plate 10 is slightly shifted in the horizontal direction (which may be in longitudinal or lateral direction of the transcribing plate 10). The positioning accuracy of a handler which is currently available or can be fabricated is lower than the micron order. Even if the transcribing plate 10 is temporarily lifted by the handler and is lowered as it is (without being positively shifted in the horizontal direction), therefore, it results in the transcribing plate 10 being shifted in the horizontal direction by a required amount.

Figure 9D:
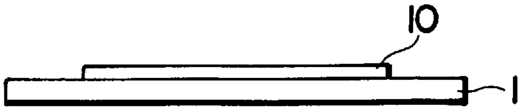
Figure 13:
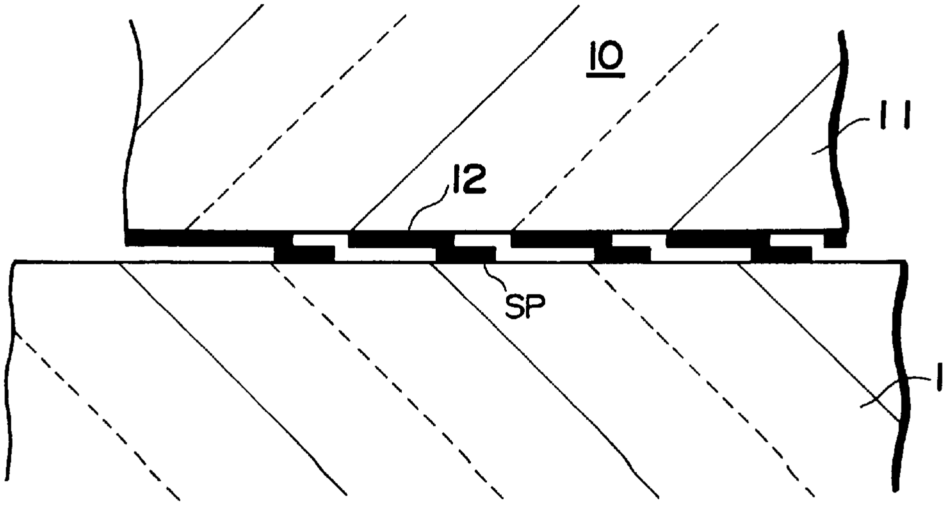

As shown in FIG. 9*d*, the transcribing plate 10 is lowered, and is placed again on the surface of the object 1. This state is illustrated in FIG. 13. Since the result is that transcribing plate 10 is shifted in the horizontal direction as described above, the chromium thin film 12 of the transcribing plate 10 and the spacer pattern SP transcribed on the object 1 are partially overlapped with each other, so that the gap between the chromium thin film 12 and the surface of the object 1 is widened.

Figure 9E:
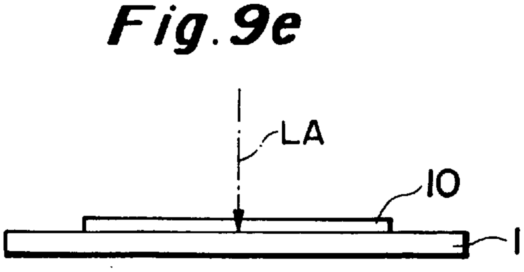
Figure 14:
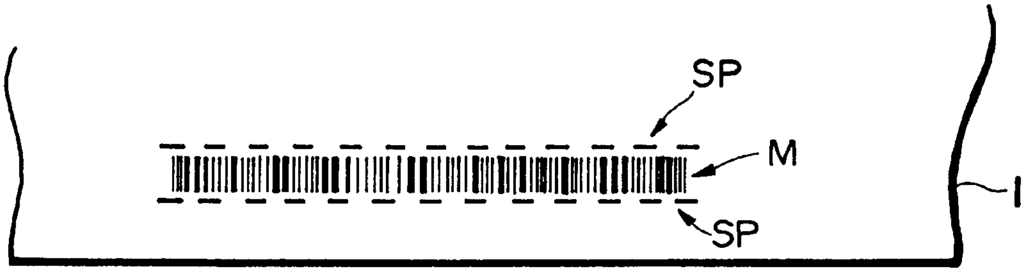
FIG. 14 is a plan view showing a spacer pattern and an identification code pattern which are formed on an object.

In this state, as shown in FIG. 9*e*, the YAG laser beam LA is so irradiated as to draw a predetermined identification code pattern in the marking area AR on the transcribing plate 10, as in the above-mentioned embodiment. At this time, laser driving may be continuous. The identification code pattern is transcribed on the surface of the object 1. The spacer pattern SP and an example of the identification code pattern M which are formed on the surface of the object 1 are illustrated in FIG. 14.

Finally, the transcribing plate 10 is separated from the object 1 upon being pulled up by the handler 5. Since the gap between the chromium thin film 12 of the transcribing plate 10 and the surface of the object 1 becomes larger by at least the thickness of the spacer pattern SP, the glass substrate is not welded.

Even when the gap between the chromium thin film of the transcribing plate and the surface of the object is very narrow, therefore, it is possible to prevent the transcribing plate and the object from being welded together by forming the spacer pattern prior to the marking. The spacer pattern is not limited to the above-mentioned example. For example, characters and numerals accompanying a bar code at both ends thereof, for example, can be also formed as the spacer pattern.

The glass substrate 11 of the transcribing plate 10 mainly has three functions. One of them is the function of holding the chromium thin film 12. The second is the function of transmitting a laser beam. The third is the function of preventing chromium vapors (particles) which evaporate or sublimate upon being heated by laser beam irradiation from scattering in the direction away from the object (the chromium vapors are basically directed toward the object 1 as described above). Consequently, the glass substrate can be also replaced with a plastic plate, Mylor and the like. It is preferable that the materials of the substrate have some degree of heat resistance particularly in order to form the spacer pattern.

The chromium thin film formed on the glass substrate 11 is not limited to one having a one-layer structure. For example, the chromium thin film may have a two-layer structure by providing a first layer (a lower layer) in black formed out of chromium oxide on the glass substrate and providing thereon a second layer (an upper layer) in a metal color formed out of chromium. The first layer in black will be useful in rapid heating because it is high in absorptivity of a laser beam.

As the material of the thin film formed on the glass substrate 11, any material may be used, provided that it evaporates or sublimates upon being heated by laser beam irradiation. This is generally a material used by a thin film forming technique such as vacuum evaporation coating and sputtering. Typical examples include chromium (Cr), tantalum (Ta), and an alloy of nickel and copper (Ni—Cu). Examples of a material which can form a thin film on glass, plastic or the like, including the foregoing materials, are Au, Pd, Ag, Cu, Cr, Al, Ta, Ni—Cu, Ni—Cr, TiN, TiC, ITO, $SiO_2$, $Si_3N_4$, Nb—Ti, Mo, Mo—Si, Co—Cr, Co—P, $Al_2O_3$, TiW, SUS, etc. Preferred one of them is a material which is not transparent, conversely speaking, a material having a color (including white or black) when the thin film is formed. Even in the case of the transparent object, therefore, the identification code pattern can be visually confirmed and easily read optically. Further, a material having heat resistance, acid resistance, and alkali resistance is preferable. Availability at low cost is also an important factor in selecting the material.

The transcribing plate 10 is constituted by the glass substrate 11 and the thin film 12 formed thereon. The glass substrate 11 and the thin film 12 may be separated from each other. That is, a material which evaporates or sublimates upon being heated by laser beam irradiation may be one independently existing as a film or a foil. In this case, the glass substrate will function as one for not holding the thin film but pressing the film or the foil against the object. The necessity of the name "transcribing plate" will be eliminated. It goes without saying that the pressing plate (the above-mentioned glass substrate) may be a plastic plate, for example.

Although in the above-mentioned embodiment, a transcribing plate which has been used is discarded every time one identification code pattern is transcribed, a plurality of times of transcription can be also made by one transcribing plate by making the transcribing plate long to shift the transcribing plate gradually (by the range of the identification code pattern) along its length for each transcription. In this case, the same may be said of the above-mentioned film or foil. The transcription can be repeated while gradually feeding the long film or foil.

It is possible to use not only the YAG laser but also the other laser light source such as a $CO_2$ laser.

The object is not limited to the PDP glass substrate. For example, an object which is not in a plate shape, for example, a cathode ray tube or an object other than glass, for example, a ceramic plate or a metal plate can be also marked. It is preferable that the object has relatively good heat resistance and has flatness.

As described in the foregoing, according to the above-mentioned marking method in the present invention, the object is not cut or engraved. Even if there is a process after the marking, particularly heat treatment, therefore, the object is not cracked. For example, the PDP glass substrate is subjected to at least five times of heat treatment by a furnace having a temperature of not less than 500° C. in order to form a rib or fix a fluorescent material in the manufacturing processes thereof. Further, the cathode ray tube is also subjected to one or two or more times of heat treatment in order to remove strain.

According to the marking method in the present invention, no glass powder or the like is produced. Therefore, the marking method is also applicable to manufacturing processes requiring a high degree of cleaning.

Furthermore, an identification code pattern can be visually confirmed, easily read optically, and accurately read by using an opaque material (which is as opaque as chromium in many cases) as a material which evaporates or sublimates upon being heated. The material of the identification code pattern is not peeled off even by the subsequent heat treatment. A lot of usable materials are not fallen off even in the etching process in which they are immersed in acid and alkali solutions.

The laser beam is irradiated through the transcribing plate (or the pressing plate) from behind the transcribing plate (or the pressing plate), and is not irradiated through the object. Therefore, an applicable object is hardly restricted. The marking method according to the present invention is also applicable to an opaque object, a thick object, an object having another material such as an $SiO_2$ thin film, and an object such as a cathode ray tube through which the laser beam cannot be irradiated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of marking a surface of an object with a laser beam, comprising the steps of:

placing a film of a material which evaporates or sublimates upon being heated by laser beam irradiation and a member exhibiting transparency to the laser beam on a surface of an object at a location over the surface of the object where it is desired to form a predetermined pattern on the surface of the object such that said material film is located between said transparent member and the surface of the object and faces the surface of the object;

irradiating said material film with a laser beam which passes through said transparent member so as to evaporate or sublimate portions of said material film using said laser beam and using said evaporated or sublimated portions of said material film to transcribe a spacer pattern on the surface of the object around an area of the surface of the object where it is desired to form said predetermined pattern;

temporarily separating said material film and said transparent member from the surface of the object having the spacer pattern formed thereon, shifting the position of said material film and said transparent member over the surface of the object, and placing the material film and transparent member on a surface of the spacer pattern so that a gap is formed between a surface of said material film facing the surface of the object and the surface of the object and so that said material film is placed over said area of the surface of the object where it is desired to form said predetermined pattern;

irradiating said material film with the laser beam so as to evaporate or sublimate portions of said material film using said laser beam and using said evaporated or sublimated portions of said material film to transcribe said predetermined pattern on the surface of the object; and removing said transparent member and said material film from the object.

2. The method according to claim 1, wherein said spacer pattern is symmetrically formed on opposite sides of said area where it is desired to form said predetermined pattern on the surface of the object.

* * * * *